United States Patent [19]

Kanda et al.

[11] Patent Number: 5,323,054
[45] Date of Patent: Jun. 21, 1994

[54] SEMICONDUCTOR DEVICE INCLUDING INTEGRATED INJECTION LOGIC AND VERTICAL NPN AND PNP TRANSISTORS

[75] Inventors: Akihiro Kanda; Mitsuo Tanaka; Takehiro Hirai; Masahiro Nakatani, all of Osaka, Japan

[73] Assignee: Matsushita Electric Industrial Co., Ltd., Osaka, Japan

[21] Appl. No.: 907,470

[22] Filed: Jul. 1, 1992

Related U.S. Application Data

[63] Continuation-in-part of Ser. No. 808,691, Dec. 17, 1991, Pat. No. 5,162,252.

[30] Foreign Application Priority Data

Jul. 1, 1991 [JP] Japan ............... 3-159268
Jul. 1, 1991 [JP] Japan ............... 3-159269

[51] Int. Cl.$^5$ .................. H01L 29/165; H01L 29/700
[52] U.S. Cl. .................. 257/574; 257/555; 257/588; 257/554
[58] Field of Search ............ 257/566, 574, 575, 554, 257/555, 576, 513, 514, 520, 586, 587, 588

[56] References Cited

U.S. PATENT DOCUMENTS

| | | | |
|---|---|---|---|
| 4,749,661 | 6/1988 | Bower | 257/586 |
| 4,826,780 | 5/1989 | Takemoto et al. | 257/575 |
| 4,984,048 | 1/1991 | Sagara et al. | 257/520 |

FOREIGN PATENT DOCUMENTS

| | | | |
|---|---|---|---|
| 0141261 | 8/1984 | Japan . | |
| 0111461 | 5/1987 | Japan . | |
| 0058865 | 2/1990 | Japan . | |
| 0211668 | 8/1990 | Japan | 257/520 |

Primary Examiner—Rolf Hille
Assistant Examiner—David B. Hardy
Attorney, Agent, or Firm—Lowe, Price, LeBlanc & Becker

[57] ABSTRACT

In a a semiconductor device having a vertical npn transistor, a vertical pnp transistor and an IIL which are integrated on the same substrate, grooves that reach an n+-type buried layer 5 serving as an emitter of the IIL and an n+-type buried layer 4 serving as a collector of the vertical npn transistor are formed at the same time, and an oxide film 101 is formed only on the sidewall of each groove; in the grooves, n+-type polycrystalline silicon films 103 and 102 are formed, which are made to serve as an emitter lead-out portion of the IIL and a collector wall of the vertical npn transistor, respectively; a p-type diffused layer 17 serving as an injector of the IIL and a p-type diffused layer 18 and p--type diffused layer 12 serving as the base thereof are respectively so formed as to be adjoining to the oxide film 101 of the emitter lead-out portion of the IIL; and a p-type diffused layer 16 serving as the base of the vertical npn transistor is so formed as to be adjoining to the oxide film 101 of the collecter wall. The semiconductor device can achieve a smaller cell size, a decrease in parasitic capacitance and an increase in operating speed.

1 Claim, 8 Drawing Sheets

SEMICONDUCTOR DEVICE INCLUDING INTEGRATED INJECTION LOGIC AND VERTICAL NPN AND PNP TRANSISTORS

This is a continuation-in-part application of U.S. Pat. application Ser. No. 07/808,691 filed on Dec. 17, 1991, now U.S. Pat. No. 5,162,252.

BACKGROUND OF THE INVENTION

1. Field of the Invention

This invention relates to a semiconductor device comprising an IIL (or I²L, intergrated injection logic) integrated with a vertical npn transistor and a vertical pnp transistor, and a method for its fabrication.

2. Description of the Prior Art

Conventional semiconductor devices can be exemplified by what is disclosed in Japanese Laid-open Patent Application No. 59-141261.

In FIG. 9, reference numeral 1 denotes a p-type semiconductor substrate; and 5, part of the emitter region of the IIL, which is an $n^+$-type buried layer formed at the same time as a collector buried layer (not shown) of a vertical npn transistor. Reference numeral 6 denotes part of a separating region, which is a $p^{30}$-type buried layer formed at the same time as a collector buried layer (not shown) of a vertical pnp transistor. Reference numeral 9 denotes an $n^-$-type epitaxial layer formed on the p-type semiconductor substrate 1 embracing the $n^{30}$-type buried layer and the $p^+$-type buried layer 6, and 10 and 12 denote part of the separating region and part of the base region of the IIL, respectively, which are $p^-$-type diffused layers formed at the same time as the collector region (not shown) of the vertical pnp transistor. Reference numeral 14 denotes an $n^+$-type diffused layer that constitutes an emitter lead-out portion of the IIL, and 17 and 18 denote an injector and part of the base region, respectively, of the IIL, which are p-type diffused layers formed at the same time as the base region (not shown) of the vertical npn transistor. Reference numerals 20 and 100 denote a collector and part of the emitter region, respectively, of the IIL, which are n-type diffused layers formed at the same time as the base region (not shown) of the vertical pnp transistor. Reference numeral 23 denotes a collector contact region of the IIL, which is an $n^+$-type diffused layer formed at the same time as the emitter region (not shown) of the vertical npn transistor.

In the conventional semiconductor device constituted in this way, the $p^-$-type diffused layer 12 serving as the base of the IIL is a diffused layer with a low impurity density formed at the same time as the collector region of the vertical pnp transistor, and hence an emitter injection efficiency can be made higher and current gain can be made greater.

Other conventional semiconductor devices in which a highly integrated high-speed vertical npn transistor and an IIL are set up together are disclosed, for example, in Japanese Laid-open Patent Application No. 62-111461. FIG. 10 illustrates a cross section of the structure of this conventional semiconductor device.

In FIG. 10, reference numeral 1 denotes a p-type semiconductor substrate; and 5, part of the emitter region of the IIL, which is an $n^+$-type buried layer formed at the same time as a collector buried layer (not shown) of a vertical npn transistor. Reference numeral 9 denotes an $n^-$-type epitaxial layer formed on the p-type semiconductor substrate 1. Reference numeral 301 denotes a groove formed at an emitter lead-out portion of the IIL; and 306, an $n^+$-type diffused layer that constitutes part of an emitter lead-out portion, formed by diffusing impurities from the bottom of the groove. Reference numeral 302 denotes an SiO₂ film formed on the surface of the $n^-$-type epitaxial layer 9. Reference numeral 303 denotes a p-type diffused layer serving as an injector of the IIL; 304, a p-type diffused layer serving as the base of the IIL; and 305, an $n^+$type diffused layer serving as a collector of the IIL.

In the conventional semiconductor device constituted in this way, the $n^+$-type diffused layer 306 is formed self-matchingly to the formation of the groove 301, and hence the emitter lead-out portion can be made narrower than in the case when an $n^+$-type diffused layer is formed at an emitter lead-out portion using a resist mask. Thus a semiconductor device in which a highly integrated high-speed vertical npn transistor and an IIL are set up together can be obtained.

However, in such conventional semiconductor devices, for example, the semiconductor device disclosed in Japanese Laid-open Patent Application No. 59-141261, the n-type diffused layer 100 is formed between the injector p-type diffused layer 17 and the emitter lead-out portion n-type diffused layer 14 and also between the base p-type diffused layer 18 and the separating region p-type diffused layer 10 so that breakdown voltage can be ensured between these diffused layers. Hence, this semiconductor device has had the problem that the cell size of the IIL is necessarily large. In addition, the presence of a parasitic capacitance between the regions formed by the n-type epitaxial layer 9 has brought about the problem that the operating speed of the IIL can not be increased with ease.

In the semiconductor device disclosed in Japanese Laid-open Patent Application No. 62-111461, the emitter lead-out portion of the IIL is formed of the groove 301 and the $n^+$-type diffused layer 306 located right beneath it, so that a difference in level may occur at this portion. Thus, this semiconductor device has been involved in the problem that disconnection or short of Al wiring tends to occur at this portion.

SUMMARY OF THE INVENTION

The present invention solves the above problems. An object thereof is to provide a semiconductor device in which an IIL, a vertical npn transistor and a vertical pnp transistor, with a high speed and high compactness, are integrated on the same wafer, and a method for the fabrication of such a semiconductor device.

To achieve the above object, the present invention provides as a first embodiment a semiconductor device comprising a vertical npn transistor, a vertical pnp transistor and an IIL; said IIL comprising a one-conductivity type semiconductor substrate (1), a reverse-conductivity type first buried layer (5) formed in said substrate, a reverse-conductivity type first semiconductor layer (9) formed on said semiconductor substrate embracing said first buried layer, a one-conductivity type first diffused layer (12) formed in said first semiconductor layer, a reverse-conductivity type second diffused layer (20) formed in singularity or plurality in said first diffused layer, a one-conductivity type third diffused layer (17) formed at a position set apart in the lateral direction with respect to said first diffused layer, a groove formed in said first semiconductor layer, so formed as to reach said first buried layer, an insulating film (101) formed only on each sidewall of said groove, and a reverse-conductivity type second semiconductor layer (103) so formed as to be connected with said first buried layer at the bottom of said groove;

said first buried layer being made to serve as an emitter of the IIL, said first diffused layer as a base of the IIL, said second diffused layer as a collector of the IIL, said third diffused layer as an injector of the IIL, and said second semiconductor layer as an emitter lead-out portion of the IIL; and said insulating film being so formed as to come into contact with the sides of said first diffused layer and said third diffused layer on their sides other than their sides opposed to each other.

As a second embodiment of the semiconductor device, the present invention provides a semiconductor device comprising a vertical npn transistor, a vertical pnp transistor and an IIL; said IIL comprising a one-conductivity type semiconductor substrate (1), a reverse-conductivity type first buried layer (5) formed in said substrate, a reverse-conductivity type first semiconductor layer (9) formed on said semiconductor substrate embracing said first buried layer, a one-conductivity type first diffused layer (12) formed in said first semiconductor layer, a reverse-conductivity type second diffused layer (20) formed in singularity or plurality in said first diffused layer, a one-conductivity type third diffused layer (17) formed at a position set apart in the lateral direction with respect to said first diffused layer, a groove formed in said first semiconductor layer, so formed as to reach said first buried layer and surround i) the sides of said first diffused layer and said third diffused layer on their sides other than their sides opposed to each other and ii) the sides of said second diffused layer at least on its sides other than one direction thereof, an insulating film (101) formed only on each sidewall of said groove, a reverse-conductivity type second semiconductor layer (103) formed in said groove, so formed as to be connected with said first buried layer at the bottom of said groove, and a conductive film formed above said first semiconductor layer and connected with said first diffused layer;

said first buried layer being made to serve as an emitter of the IIL, said first diffused layer as a base of the IIL, said second diffused layer as a collector of the IIL, said third diffused layer as an injector of the IIL, said second semiconductor layer as an emitter lead-out portion of the IIL, and said conductive film as a base electrode of the IIL; said first diffused layer being divided into plural regions by said groove; and said conductive film being so formed as to be connected with all the plural regions of said first diffused layer divided by said groove.

The present invention also provides a method of fabricating a semiconductor device having a vertical npn transistor, a vertical pnp transistor and an IIL, comprising the steps of forming in a one-conductivity type semiconductor substrate a reverse-conductivity type first buried layer serving as an emitter of the IIL; forming on said semiconductor substrate having said first buried layer a reverse-conductivity type first semiconductor layer; forming in said first semiconductor layer a one-conductivity type first diffused layer serving as a base of the IIL; forming in said first diffused layer a reverse-conductivity type second diffused layer in singularity or plurality, serving as a collector or collectors of the IIL; forming a one-conductivity type third diffused layer serving as an injector of the IIL, at a position set apart in the lateral direction with respect to said first diffused layer; forming in said first semiconductor layer a groove that reaches said first buried layer; forming an insulating film only on each sidewall of said groove; and forming in said groove a reverse-conductivity type second semiconductor layer serving as an emitter lead-out portion of the IIL, so as to be connected with said first buried layer at the bottom of said groove;

said insulating film being so formed as to come into contact with the sides of said first diffused layer and said third diffused layer on their sides other than their sides opposed to each other; and the groove having the insulating film on its sidewalls and the second semiconductor layer inside the groove, serving as a collector lead-out portion in the vertical npn transistor, being formed at the same time when the groove having the insulating film on its sidewalls and the second semiconductor layer inside the groove, serving as the emitter lead-out portion of the IIL, are formed.

As another embodiment of the method, the present invention still also provides a method of fabricating a semiconductor device having a vertical npn transistor, a vertical pnp transistor and an IIL, comprising the steps of forming in a one-conductivity type semiconductor substrate a reverse-conductivity type first buried layer serving as an emitter of the IIL; forming on said semiconductor substrate having said first buried layer a reverse-conductivity type first semiconductor layer; forming in said first semiconductor layer a one-conductivity type first diffused layer serving as a base of the IIL; forming in said first diffused layer a reverse-conductivity type second diffused layer in singularity or plurality, serving as a collector or collectors of the IIL; forming a one-conductivity type third diffused layer serving as an injector of the IIL, at a position set apart in the lateral direction with respect to said first diffused layer; forming in said first semiconductor layer a groove that reaches said first buried layer, so as to surround i) the sides of said first diffused layer and said third diffused layer on their sides other than their sides opposed to each other and ii) the sides of said second diffused layer at least on its sides other than one direction thereof; forming an insulating film only on each sidewall of said groove; forming in said groove a reverse-conductivity type second semiconductor layer serving as an emitter lead-out portion of the IIL, connected with said first buried layer at the bottom of said groove; and forming above said first semiconductor layer a conductive film serving as a base electrode of the IIL, connected with said first diffused layer;

said first diffused layer being divided into plural regions by said groove; and said conductive film being so formed as to be connected with all the plural regions of said first diffused layer divided by said groove.

In the above constitution of the present invention, the groove that reaches the emitter buried layer is formed around injector and base region diffused layers of the IIL in such a way that it comes into contact with these diffused layers, and the insulating film is formed only on the sidewalls of the groove. Thereafter the semiconductor layer is formed inside the groove. Hence, any n-type diffused layer conventionally formed between the injector and the emitter lead-out portion is no longer required, so that IIL can be made more highly compact. In addition, the presence of the insulating film on the sidewalls of the base region makes it possible to decrease parasitic capacitance at the sides between the emitter and the base, so that the operating speed of the IIL can be made higher. Moreover, the areas of the sides at which the emitter and the base are joined can be decreased and therefore the base current at the side of the base region can be decreased to enable improvement in the current amplification of the IIL. Hence, a current amplification equal to what has been conventionally accomplished can be obtained with a smaller collector area than that of conventional structures, and therefore a current amplification equal to what has been conventionally accomplished can be obtained using the IIL having a smaller cell size. Since the groove is flatly filled with the semiconductor layer, an Al wiring that passes this portion does not cause disconnection or short. Thus, the present invention can provide a semiconductor device in which an IIL, a vertical pnp transistor and a vertical npn transistor, with a high speed and high compactness, are integrated.

In another embodiment, the groove serving as the emitter lead-out portion is formed at least on the sides other than one direction of the collector regions of the IIL, and the base regions of the IIL, divided into plural regions by the groove thus formed, are connected with the base electrode formed above an epitaxial layer. Hence, it becomes unnecessary to provide a p-type diffused layer formed between collectors in order to keep a high breakdown voltage between them, and, since the space between collectors can be made to correspond only to the width of the groove, the IIL can be made highly compact.

Moreover, the area of the groove serving as the emitter lead-out portions increases, and hence emitter currents can flow through a wider path to bring about a decrease in emitter resistivity. Compared with conventional IIL structures, since the oxide film is present on the sides of the collector regions and base regions, the joining capacity between the emitter and base and the joining capacity between the collector and base can be decreased. Furthermore, the base regions divided into plural regions by the groove can be connected with a conductive film having a low resistivity, and hence the base resistivity can be decreased compared with a conventional structure in which the base region is connected with a p-type diffused layer formed in a relatively low density. Thus, the operating speed of the reversely operated npn transistor in the IIL can be increased, and an IIL capable of operating at a high speed can be obtained. Thus, the present invention can provide a semiconductor device in which an IIL, a vertical pnp transistor and a vertical npn transistor, with a high speed and high compactness, are integrated.

DESCRIPTION OF THE PREFERRED EMBODIMENTS

Preferred embodiments of the semiconductor device and method for its fabrication according to the present invention will be described below with reference to accompanying drawings.

Figure 1:
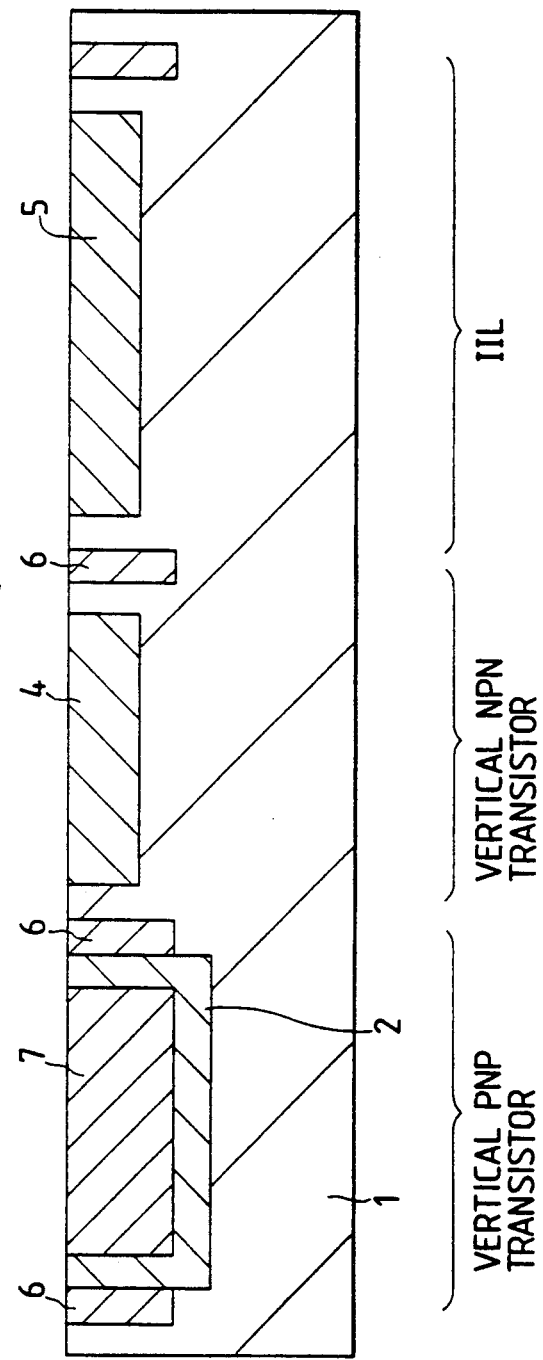
FIG. 1 is a cross-sectional illustration of a first step in the fabrication of a semiconductor device in a first embodiment of the present invention.
Figure 2:
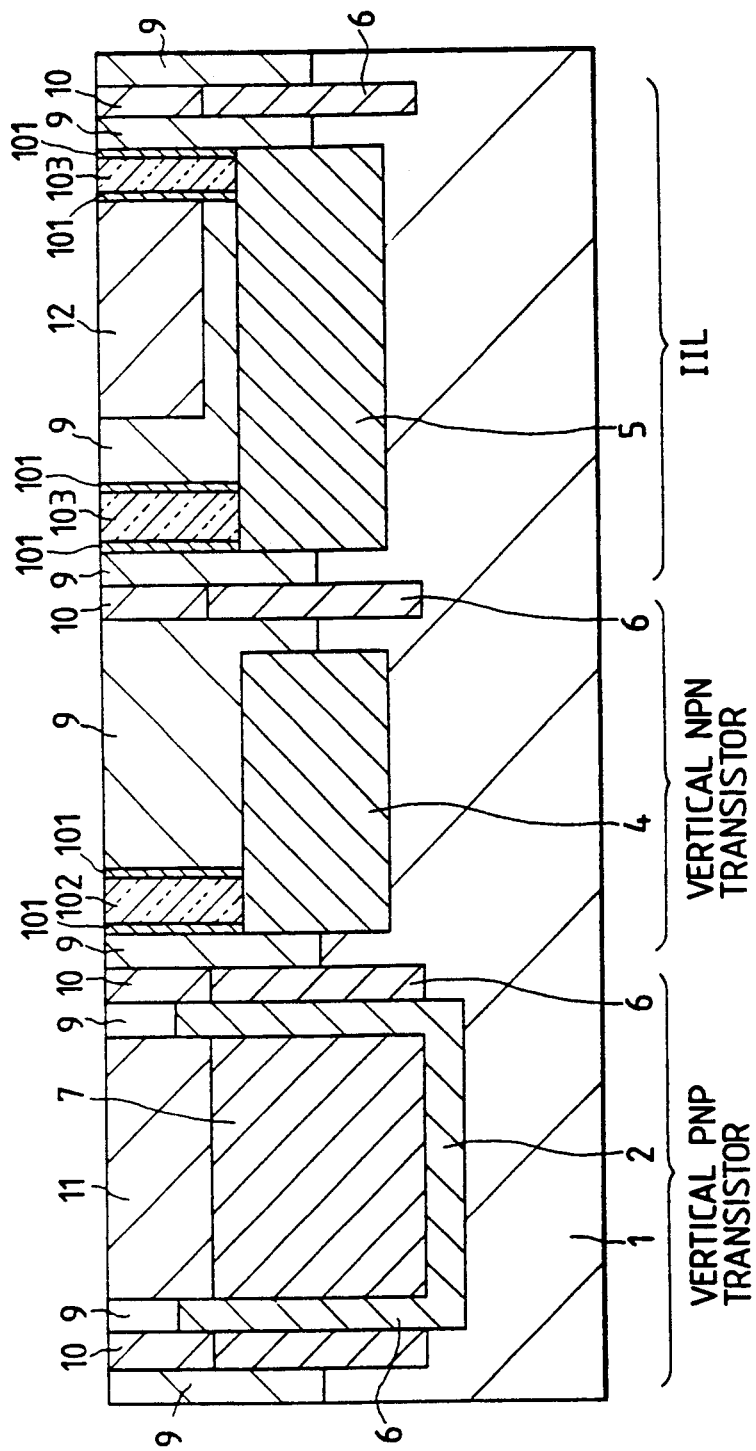
FIG. 2 is a cross-sectional illustration of a second step in the fabrication of a semiconductor device in the first embodiment of the present invention.
Figure 3:
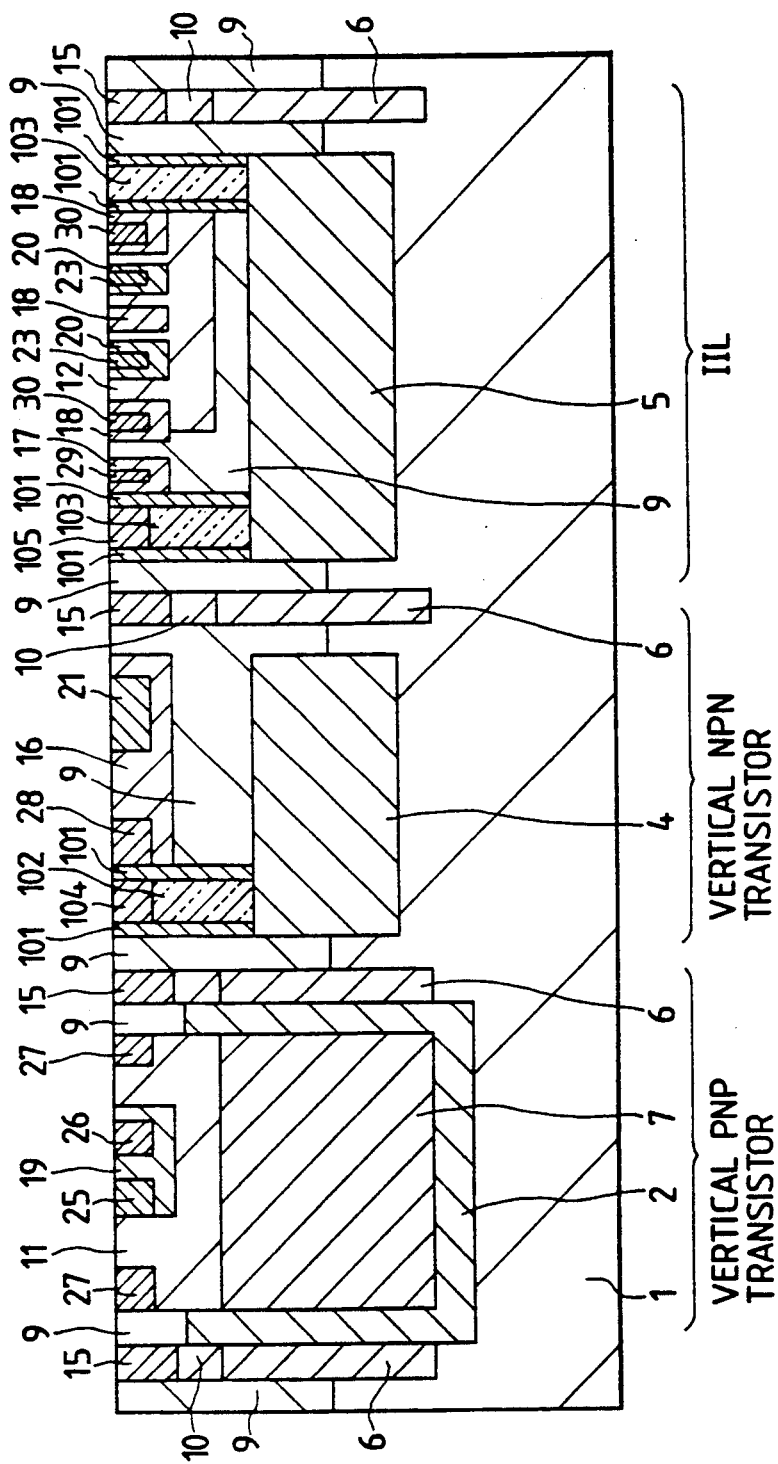
FIG. 3 is a cross-sectional illustration of a third step in the fabrication of a semiconductor device in the first embodiment of the present invention.
Figure 4:
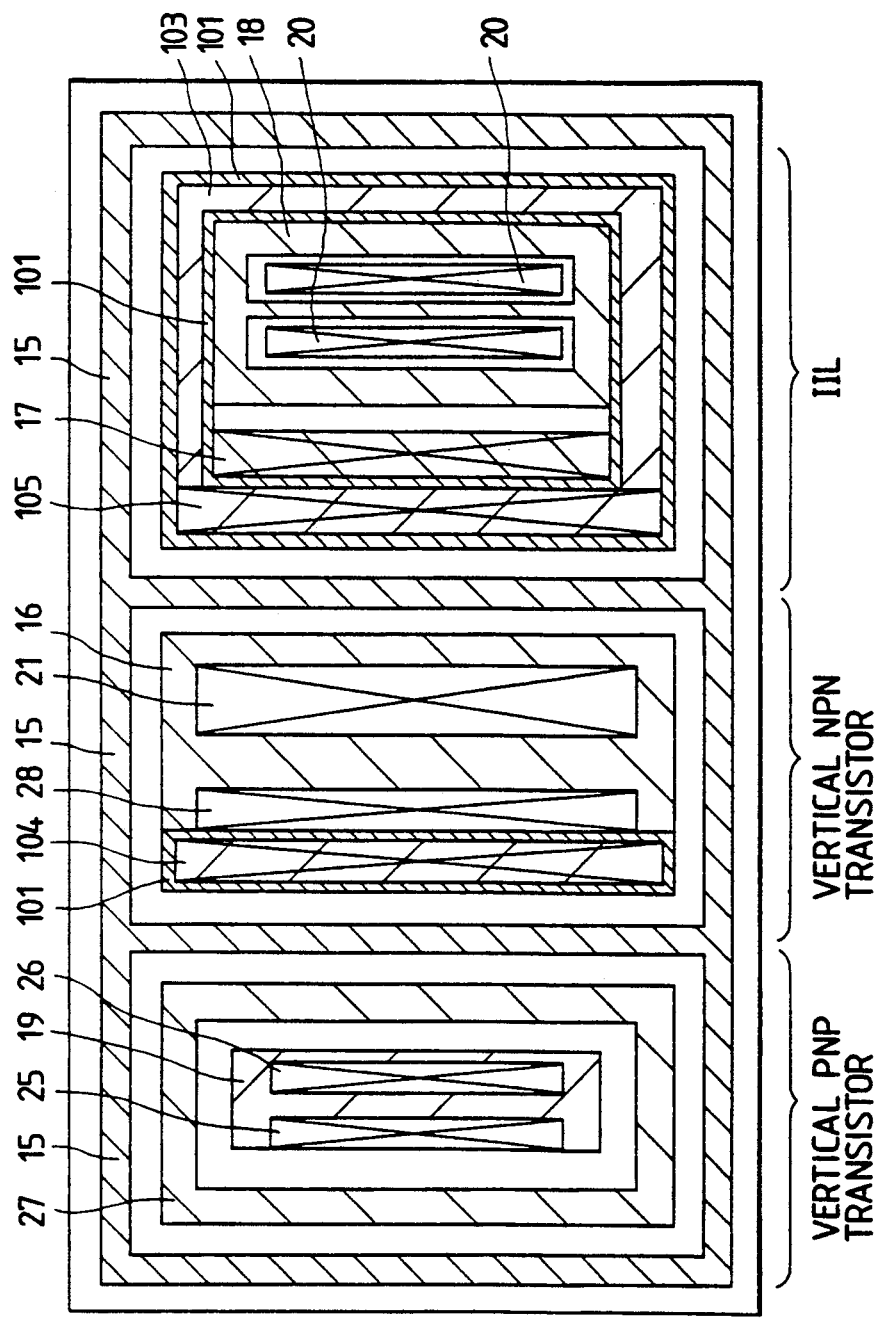
FIG. 4 is a plan view of the semiconductor device in the first embodiment of the present invention.
Figure 9:
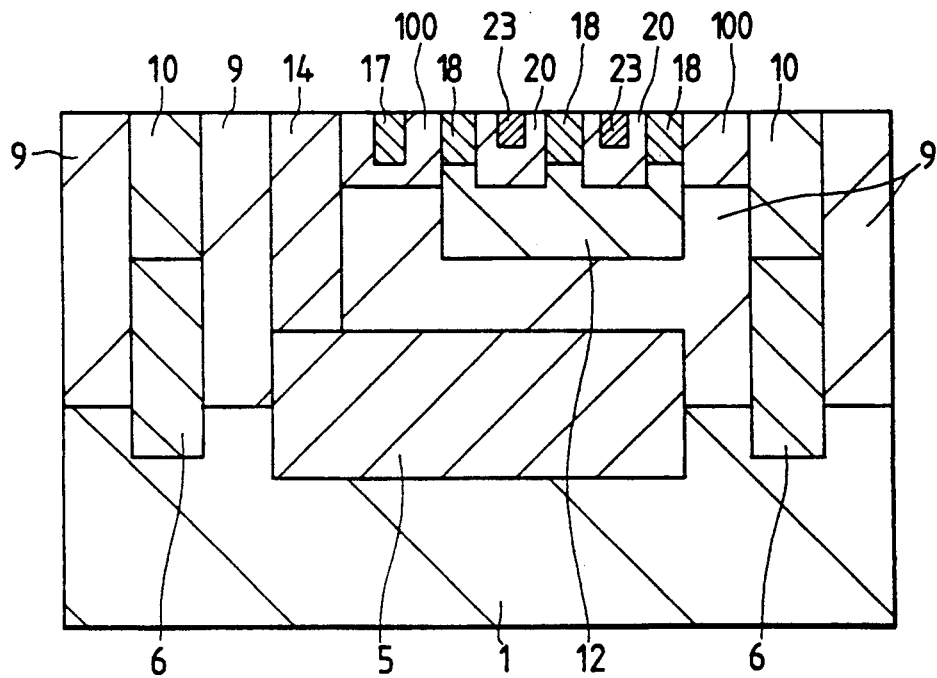
FIG. 9 is a cross-sectional structure of a conventional semiconductor device.
Figure 10:
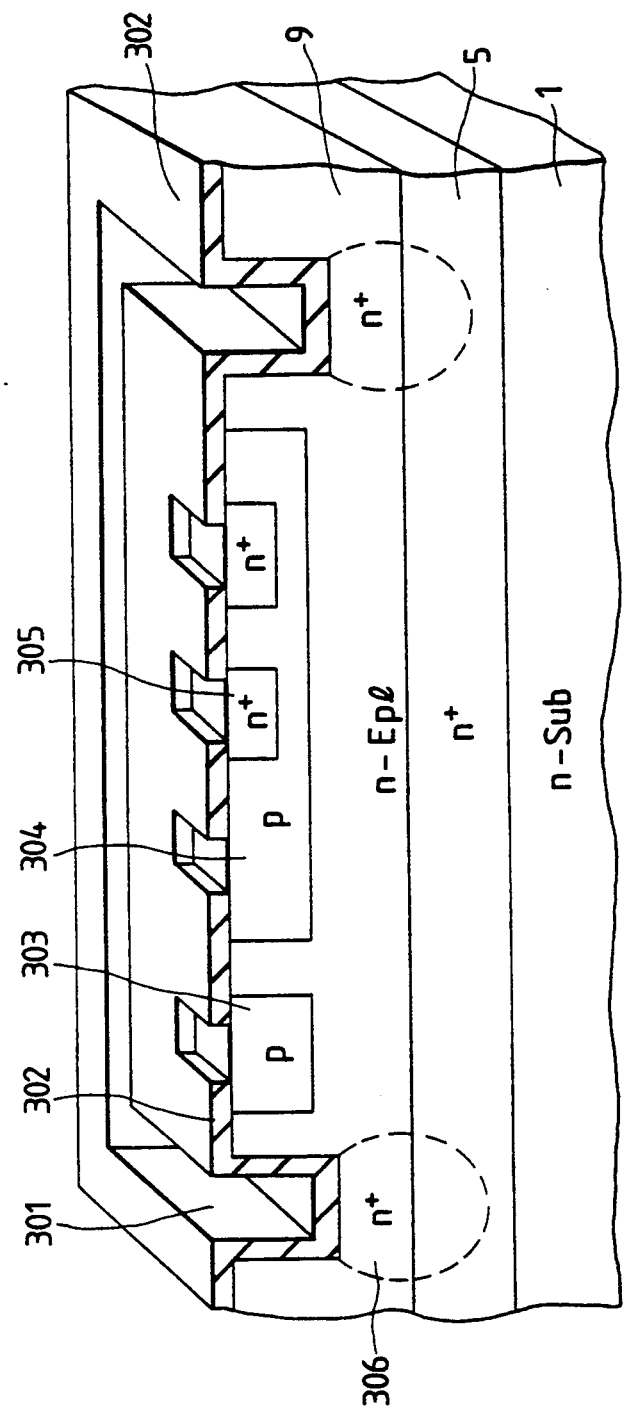
FIG. 10 is a cross-sectional structure of another conventional semiconductor device.

FIGS. 1 to 3 cross-sectionally illustrate a process of fabricating a semiconductor device according to a first embodiment of the present invention, integrated therein with a vertical npn transistor, a vertical pnp transistor and an IIL having an emitter region, a base region, a collector region and an injector region. FIG. 4 is a plan view of the semiconductor device in the first embodiment of the present invention. In these drawings, the same components have the same reference numerals as those in FIG. 9 illustrating a conventional semiconductor device.

As shown in FIG. 1, a p-type (111) semiconductor substrate 1 with an average resistivity of, e.g., from 10 to 20 $\Omega$·cm is ion-implanted with phosphorus under conditions of 40 keV and $1\times10^{13}$/cm$^2$, followed by heating, e.g., at about 1,200° C. for about 120 minutes to form an n-type buried layer 2 which separates the collector region of the vertical pnp transistor from the p-type semiconductor substrate 1. Next, for example, using a resist as a mask, the substrate is ion-implanted with arsenic under conditions of 60 keV and $1\times10^{15}$/cm$^2$, followed by heating at about 900° C. for about 30 minutes to form an n$^+$-type buried layer 4 serving as a collector buried layer of the vertical npn transistor and an n$^+$-type buried layer 5 that constitutes part of the emitter region of the IIL.

Next, for example, using a resist as a mask, ion implantation of boron is carried out under conditions of 40 keV and $1\times10^{14}$/cm$^2$, followed by heating at about 1,100° C. for about 180 minutes to form a p$^+$-type buried layer 7 serving as a collector buried layer of the vertical pnp transistor, and a p$^+$-type buried layer 6 that constitutes part of the device separating region and serves as a lower separating region. In this instance, the coefficients of diffusion of the impurities become larger in order of arsenic, boron and phosphorus, and hence the depths of the buried layers become larger in order of the n$^+$-type buried layers 4 and 5, p$^+$-type buried layers 6 and 7 and the n-type buried layer 2.

Next, as shown in FIG. 2, on the p-type semiconductor substrate 1, an n$^-$-type epitaxial layer 9 with, e.g., an average resistivity of about 1 $\Omega$·cm and a thickness of about 2.5 $\mu$m is formed. Next, for example, using a resist as a mask, ion implantation of boron is carried out under conditions of 80 keV and $2\times10^{12}$/cm$^2$, followed by heating at about 1,100° C. for about 100 minutes to form a p$^-$-type diffused layer 11 that constitutes part of the collector region of the vertical pnp transistor, a p$^-$-type diffused layer 12 that constitutes part of the base region of the IIL, and a p$^-$-type diffused layer 10 that constitutes part of the device separating region and serves as an upper separating region. In this instance, the coefficients of diffusion of the impurities become larger in order of arsenic, boron and phosphorus, and hence the rises of the buried layers become larger in order of the n+-type buried layers 4 and 5, p+-type buried layers 6 and 7 and the n-type buried layer 2.

Next, for example, using a resist as a mask, anisotropic etching is carried out so that grooves with a width of about 1 μm reaching the n+-type buried layers 4 and 5, respectively, are formed at the position serving as a collector lead-out portion of the vertical npn transistor and at the position adjoining to the p−-type diffused layer and serving as an emitter lead-out portion of the IIL, respectively, followed by heating (thermal oxidation) at about 900° C. for about 20 minutes to form oxide films of about 50 nm thick each in the grooves. Thereafter, the oxide films at the bottoms of the grooves are removed by anisotropic etching so that the oxide films 101 remain only on the sidewalls of the grooves. Next, a polycrystalline silicon film is deposited in each groove in a thickness of about 2 μm, and, for example, POCl$_3$ is diffused at about 950° C. for about 30 minutes, followed by etchback or polishing to remove the polycrystalline silicon film except those in the grooves, thereby forming an n+-type polycrystalline silicon film 102 serving as the collector wall region of the vertical npn transistor and an n+-type polycrystalline silicon film 103 serving as the emitter lead-out portion of the IIL.

Next, as shown in FIG. 3, for example, using a resist as a mask, ion implantation of boron is carried out under conditions of 30 keV and $2 \times 10^{13}/cm^2$, followed by heating at about 900° C. for about 30 minutes to form a p-type diffused layer 16 serving as the base region of the vertical npn transistor, a p-type diffused layer 17 serving as the injector region of the IIL, a p-type diffused layer 18 that constitutes part of the base region of the IIL, and a p-type diffused layer 15 that constitutes part of the device separating region. Here, the p-type diffused layer 17 serving as the injector region of the IIL and the p-type diffused layer 18 that constitutes part of the base region of the IIL are formed in such a way that their sides other than their sides opposed to each other come into contact with the oxide film 101 at one sidewall of the groove serving as the emitter lead-out portion. The p-type diffused layer 16 serving as the base region of the vertical npn transistor is also formed in such a way that its side in one direction comes into contact with the oxide film 101 on one sidewall of the groove serving as the collector wall region. The resulting configuration is shown in FIG. 4, the plan view.

Next, for example, using a resist as a mask, ion implantation of phosphorus is carried out under conditions of 80 keV and $3.6 \times 10^{13}/cm^2$ to form an n-type diffused layer 19 serving as the base region of the vertical pnp transistor and an n-type diffused layer 20 serving as the collector region of the IIL.

Then a polycrystalline silicon film (not shown in the drawings) is formed on the regions serving as the collector contact, base contact and emitter of the vertical pnp transistor, on the regions serving as the collector contact, base contact and emitter of the vertical npn transistor and on the regions of the injector contact, collector contact, base contact and emitter contact of the IIL. Thereafter, for example, using a resist as a mask, the polycrystalline silicon film formed on the region serving as the base contact of the vertical pnp transistor, on the regions serving as the collector contact and emitter of the vertical npn transistor and on the regions of the collector contact and emitter contact of the IIL, is ion-implanted with arsenic under conditions of 60 keV and $1 \times 10^{16}/cm^2$, followed by heating a about 950° C. for about 60 minutes to make the arsenic diffuse from the polycrystalline silicon film, thereby forming an n+-type diffused layer 25 serving as the base contact region of the vertical pnp transistor, an n+-type diffused layer 104 serving as the collector contact region and an n+-type diffused layer 21 serving as the emitter region, of the vertical npn transistor, and an n+-type diffused layer 23 (which is in plurality in the drawings) serving as the collector contact region and an n+-type diffused layer 105 serving as the emitter contact region, of the IIL.

Next, for example, using a resist as a mask, the polycrystalline silicon film formed on the region serving as the base contact of the vertical npn transistor, on the regions serving as the collector contact and emitter of the vertical pnp transistor and on the regions serving as the injector contact and base contact of the IIL, is ion-implanted with boron under conditions of 30 keV and $2 \times 10^{16}/cm^2$, followed by heating at about 900° C. for about 45 minutes to make the boron diffuse from the polycrystalline silicon film, thereby forming a p+-type diffused layer 28 serving as the base contact region of the vertical npn transistor, a p+-type diffused layer 27 serving as the collector contact region and a p+-type diffused layer 26 serving as the emitter region, of the vertical pnp transistor, and a p+-type diffused layer 29 serving as the injector contact region and a p+-type diffused layer 30 serving as the base contact region, of the IIL. As a final step, for example, using Al or the like, electrode wiring may be formed. The present semiconductor device is thus completed.

As described above, the present embodiment is characterized in that the grooves that reach the n+-type buried layer 5 serving as the emitter of the IIL and the n+-type buried layer 4 serving as the collector of the vertical npn transistor are formed at the same time, and the oxide film 101 is formed only on the sidewall of each groove; in the grooves, the n+-type polycrystalline silicon films 103 and 102 are formed, which are made to serve as the emitter lead-out portion of the IIL and the collector wall of the vertical npn transistor, respectively; the p-type diffused layer 17 serving as the injector of the IIL and the p-type diffused layer 18 and p−-type diffused layer 12 serving as the base thereof are respectively so formed as to be adjoining to the oxide film 101 of the emitter lead-out portion of the IIL; and the p-type diffused layer 16 serving as the base of the vertical npn transistor is so formed as to be adjoining to the oxide film 101 of the collecter wall.

Hence, in the IIL, the space between the emitter lead-out portion and the injector can be made to correspond to the thickness of the oxide film (about 50 nm). In the vertical npn transistor, the space between the collector wall and the base can be made to correspond to the thickness of the oxide film (about 50 nm). Thus the cell size of the ILL and the vertical npn transistor each can be made smaller. In addition, in the IIL, the oxide film is formed on one sides of the p-type diffused layer 18 and p-type diffused layer 12 serving as the base, and hence the parasitic capacitance between the base and emitter can be decreased to enable achievement of an increase in the operating speed.

Figure 5:
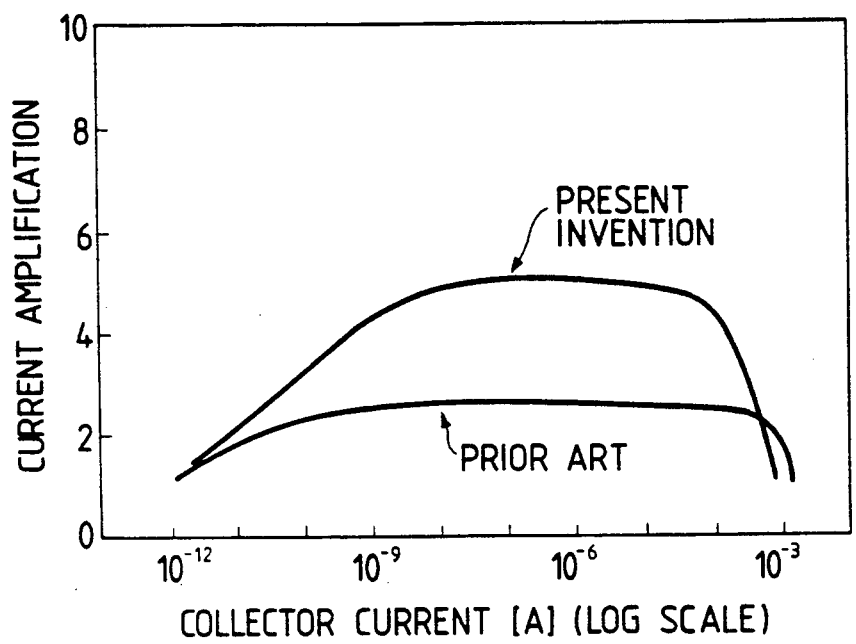
FIG. 5 is a graph to show collector current dependence of current amplification of the IIL in the first embodiment of the present invention.

The oxide film formed on the side of this base region brings about a decrease in the area of the side at which the emitter and the base are joined, and hence the base current at the side of the base region can be decreased to enable improvement in the current amplification of the IIL. FIG. 5 shows collector current dependence of the current amplification of the IIL. As is seen therefrom, the current amplification of the IIL can be greatly improved compared with conventional IILs. Hence, a current amplification equal to what has been conventionally accomplished can be obtained with a smaller collector area than that of conventional structures, and a current amplification equal to what has been conventionally accomplished can be obtained even when the sell size of the IIL is made smaller.

Moreover, since also in the vertical npn transistor the oxide film is formed on the side of the p-type diffused layer serving as the base, the parasitic capacitance between the base and emitter can be decreased to enable achievement of an increase in the operating speed. Thus, a semiconductor device in which an IIL, a vertical pnp transistor and a vertical npn transistor, with a high speed and high compactness, are integrated can be obtained.

Figure 6:
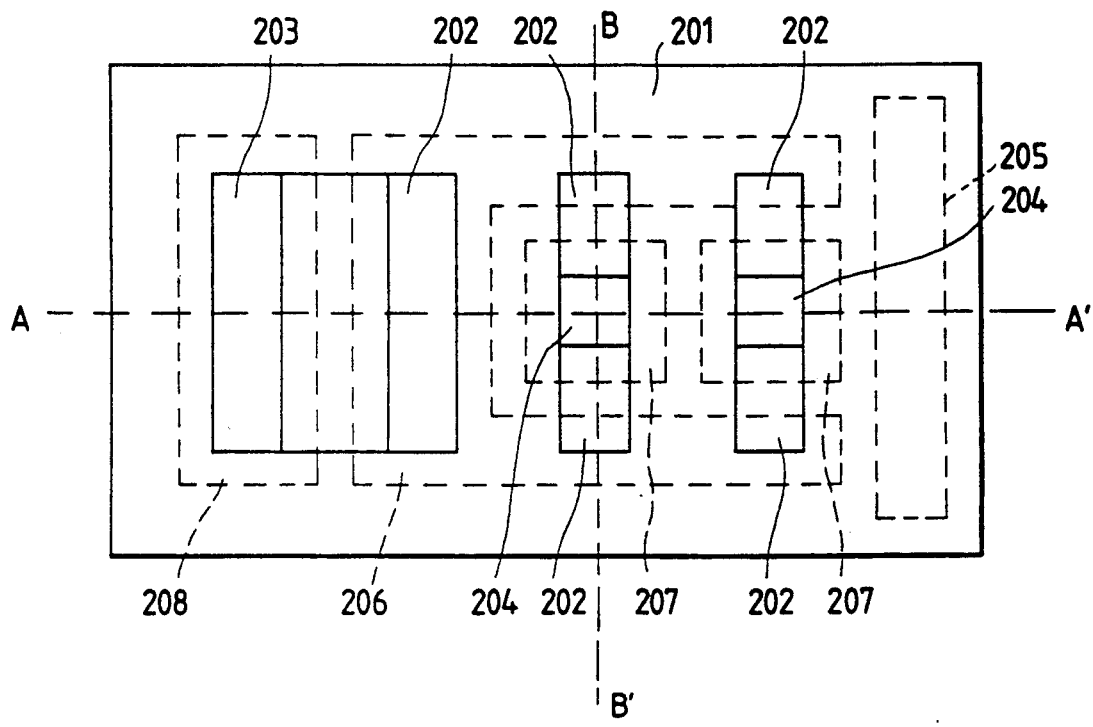
FIG. 6 is a plan view of the semiconductor device in a second embodiment of the present invention.
Figure 7:
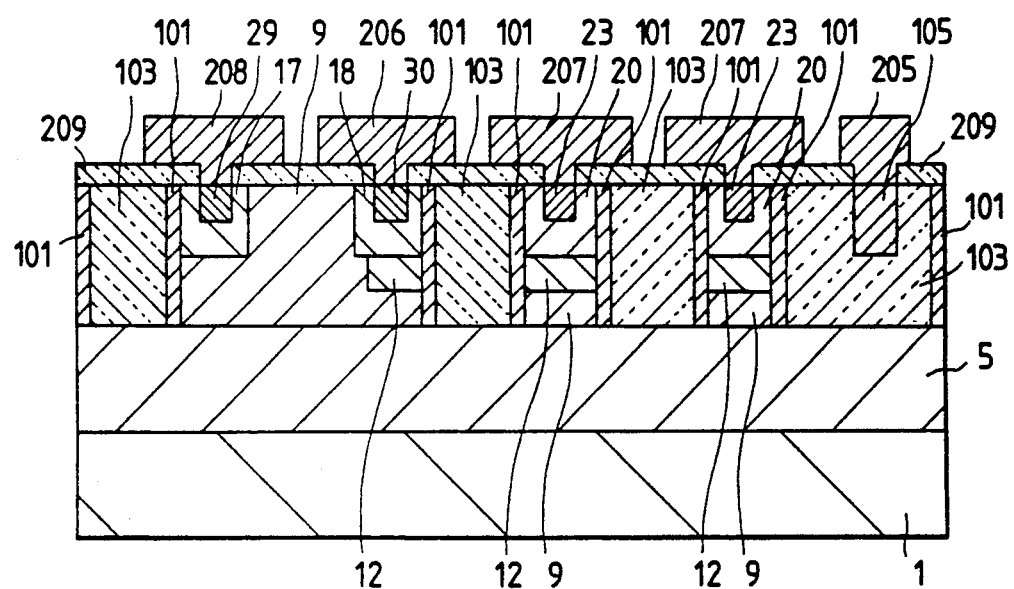
FIG. 7 is a cross-sectional illustration along the line A—A' in FIG. 6, of the semiconductor device in the second embodiment of the present invention.
Figure 8:
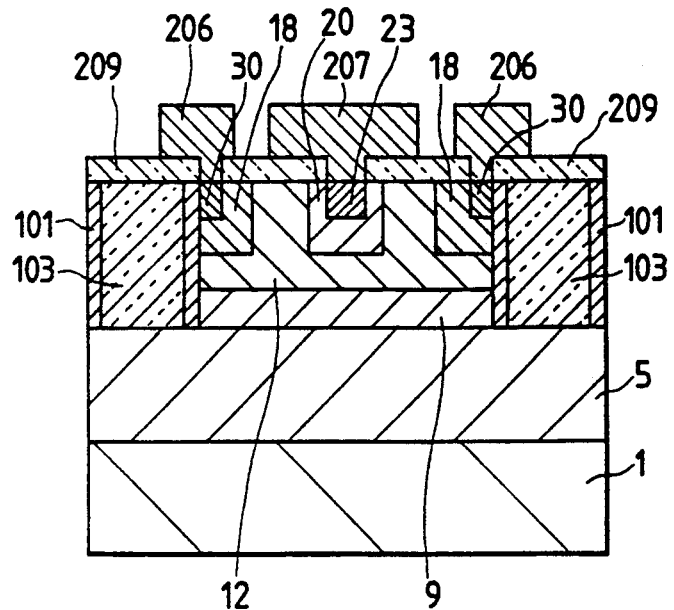
FIG. 8 is a cross-sectional illustration along the line B—B' in FIG. 6, of the semiconductor device according to the second embodiment of the present invention.

FIG. 6 is a plan view of the semiconductor device in a second embodiment of the present invention. FIGS. 7 and 8 are cross-sectional illustrations along the broken lines A—A' and B—B', respectively, of the semiconductor device shown in FIG. 6. In these drawings, the same components have the same reference numerals as those in FIG. 9 illustrating a conventional semiconductor device. FIGS. 6 and 7 illustrate an instance in which the IIL have two collector regions.

As shown in FIGS. 7 and 8, a p-type (111) semiconductor substrate 1 with an average resistivity of, e.g., from 10 to 20 $\Omega$·cm is ion-implanted, for example, with arsenic using a resist as a mask, under conditions of 60 keV and $1 \times 10^{15}/cm^2$, followed by heating at about 900° C. for about 30 minutes to form an n$^+$-type buried layer 5 that constitutes part of the emitter region of the IIL.

Next, on the p-type semiconductor substrate 1, an n$^-$-type epitaxial layer 9 with, e.g., an average resistivity of about 1 $\Omega$·cm and a thickness of about 2.5 $\mu$m is formed. Next, for example, using a resist as a mask, ion implantation of boron is carried out under conditions of 80 keV and $2 \times 10^{12}/cm^2$, followed by heating at about 1,100° C. for about 100 minutes to form a p$^-$-type diffused layer 12 that constitutes part of the base region of the IIL.

Next, for example, using a resist as a mask, anisotropic etching is carried out so that a groove reaching the n$^+$-type buried layer 5 is formed at the position adjoining to the p$^-$-type diffused layer 12, at the position where the p$^-$-type diffused layer 12 is divided into three regions and at the position serving as an emitter lead-out portion of the IIL. Here, the groove has a width of about 0.5 $\mu$m at its narrower portion and about 1 $\mu$m at its broader portion. Next, thermal oxidation is carried out at about 900° C. for about 20 minutes to form an oxide film of about 50 nm thick in the groove. Thereafter, the oxide film at the bottom of the groove is removed by anisotropic etching so that the oxide film 101 is formed only on the sidewalls of the groove. Next, a polycrystalline silicon film is deposited in a thickness of about 2 $\mu$m, and, for example, POCl$_3$ is diffused at about 950° C. for about 30 minutes, followed by etchback or polishing to remove the polycrystalline silicon film except those in the groove, thereby forming an n$^+$-type polycrystalline silicon film 103 serving as the emitter lead-out portion of the IIL.

Next, for example, using a resist as a mask, ion implantation of boron is carried out under conditions of 30 keV and $2 \times 10^{13}/cm^2$, followed by heating at about 900° C. for about 30 minutes to form a p-type diffused layer 17 serving as the injector region of the IIL, a p-type diffused layer 18 that constitutes part of the base region of the IIL. Here, the p-type diffused layer 17 serving as the injector region and the p-type diffused layer 18 that constitutes part of the base region are so formed as to be adjoining to the oxide film 101 at its sidewalls serving as the emitter lead-out portion. To illustrate this state with reference to FIG. 6, a p-type region 203 serving as the injector region formed by the p-type diffused layer 17 and a p-type region 202 serving as the base region formed by the p-type diffused layer 18 are so formed as to be surrounded by the groove 201 serving as the emitter lead-out portion except for the sides opposing between the injector region and the base region.

Next, for example, using a resist as a mask, ion implantation of phosphorus is carried out under conditions of 80 keV and $3.6 \times 10^{13}/cm^2$ to form n-type diffused layers 20 serving as the collector regions of the IIL, inside the p-type diffused layers 12 divided by the groove. Here, the n-type diffused layers 20 serving as the collector regions are formed in such a way that their both sides come into contact with the oxide film 101 formed on the groove sidewall serving as the emitter lead-out portion. To illustrate this state with reference to FIG. 6, n-type regions 204 serving as the collector regions formed by the n-type diffused layers 20 are so formed as to be surrounded at their both sides by the groove 201 serving as the emitter lead-out portion. The sides of the n-type regions not coming into contact with the groove are surrounded by p-type regions serving as the base regions.

Next, as shown in FIG. 7, an oxide film 209 (SiO$_2$ film) with a thickness of about 200 $\mu$m is formed on the surface of the semiconductor device. Thereafter the regions corresponding to an emitter contact, a base contact, a collector contact and an injector contact of the IIL are opened, and a polycrystalline silicon film is deposited on the whole surface in a thickness of about 300 nm. Next, for example, using a resist as a mask, anisotropic etching is carried out to form an emitter polycrystalline silicon electrode 205, a base polycrystalline silicon electrode 206, a collector polycrystalline silicon electrode 207 and an injector polycrystalline silicon electrode 208. Here, as shown in FIG. 6, the base polycrystalline silicon electrode 206 is so formed as to connect the p-type regions 202 serving as the plural base regions divided by the groove 201.

Next, for example, using a resist as a mask, the polycrystalline silicon film formed on the regions of the collector contact and emitter contact of the IIL is ion-implanted with arsenic under conditions of 60 keV and $1 \times 10^{16}/cm^2$, followed by heating at about 950° C. for about 60 minutes to make the arsenic diffuse from the polycrystalline silicon film, thereby forming n$^{30}$-type diffused layers 23 serving as the collector contact regions and an n$^+$-type diffused layer 105 serving as the emitter contact region, of the IIL.

Next, for example, using a resist as a mask, the polycrystalline silicon film formed on the regions serving as the injector contact and base contact of the IIL is ion-implanted with boron under conditions of 30 keV and $2\times 10^{16}/cm^2$, followed by heating at about 900° C. for about 45 minutes to make the boron diffuse from the polycrystalline silicon film, thereby forming a $p^+$-type diffused layer 29 serving as the injector contact region and a $p^+$-type diffused layer 30 serving as the base contact region, of the IIL. Here, as shown in FIG. 8, the n-type diffused layer 20 which is a collector region of the IIL is formed inside the p-type diffused layer 12 which is a base region, and the p-type diffused layer 18 that constitutes part of the base region is formed on both sides of the n-type diffused layer 20. The $p^+$-type diffused layer 30 serving as the base contact region is formed at the part of the base polycrystalline silicon electrode 206 formed on the both sides of the collector polycrystalline silicon electrode 207. As a final step, for example, using Al or the like, electrode wiring may be formed. The present semiconductor device is thus completed.

In the formation of the IIL described here, a vertical npn transistor and a vertical pnp transistor can be simultaneously formed according to the same procedure as in the first embodiment.

As described above, the present embodiment is characterized in that the groove that reaches the $n^+$-type buried layer 5 serving as the emitter of the IIL is formed, and the oxide film 101 is formed only on the sidewall of the groove; in the groove, the $n^+$-type polycrystalline silicon film 103 is formed, which is made to serve as the emitter lead-out portion of the IIL; the p-type diffused layer 17 serving as the injector of the IIL and the p-type diffused layer 18 and $p^-$-type diffused layer 12 serving as the base thereof are respectively so formed as to be adjoining to the oxide film 101 of the emitter lead-out portion of the IIL; and the groove 201 serving as the emitter lead-out portion of the IIL is formed at least on the sides other than one direction, of the n-type regions 204 serving as the collector regions of the IIL, and the p-type diffused layers 202 serving as the base regions of the IIL, divided into plural regions by the groove thus formed, are connected with the base polycrystalline silicon electrode 206 formed above the n-type epitaxial layer 9.

Hence, in the IIL, it becomes unnecessary to provide a p-type diffused layer formed between collectors in order to keep a high breakdown voltage between them, and, since the space between collectors can be made to correspond only to the width of the groove, the IIL can be made highly compact.

Moreover, since the area of the groove 201 serving as the emitter lead-out portions increases, emitter currents can flow through a wider path to bring about a decrease in emitter resistivity. Compared with conventional IIL structures, since the oxide film 101 is present on the sides of the n-type regions 204 serving as the collector regions and the p-type regions 202 serving as the base regions are divided into plural regions by the groove 201, the joining capacity between the emitter and base and the joining capacity between the collector and base can be decreased. Furthermore, the p-type regions 202 serving as the base regions divided into plural regions by the groove are connected with the base polycrystalline silicon electrode 206 made to have a low resistivity (sheet resistivity: about 120 Ω) because of the ion implantation of boron in a high density, and hence the base resistivity can be decreased compared with a conventional structure in which the base region is connected with a p-type diffused layer (sheet resistivity: about 2,500 Ω) formed in a relatively low density. Thus, the operating speed of the npn transistor operating in reverse to the IIL can be increased, and an IIL capable of operating at a high speed can be obtained.

What is claimed is:

1. A semiconductor device comprising a vertical npn transistor, a vertical pnp transistor and an IIL; said IIL comprising:

a one-conductivity type semiconductor substrate;

a reverse-conductivity type first buried layer formed in said substrate;

a reverse-conductivity type first semiconductor layer formed on said semiconductor substrate adjacent said first buried layer;

a one-conductivity type first diffused layer formed in said first semiconductor layer;

at least one reverse-conductivity type second diffused layer formed in said first diffused layer;

a one-conductivity type third diffused layer formed at a position spaced laterally with respect to said first diffused layer;

a groove formed in said first semiconductor layer, said groove having sidewalls and a bottom so formed as to reach said first buried layer, said groove surrounding sides of said first diffused layer and said third diffused layer, said sides being other than sides of said first and third diffused layers opposed to each other and further surrounding opposing sides of said second diffused layer, sides other than said opposing sides of said second diffused layer being surrounded by said first diffused layer;

an insulating film formed only on each sidewall of said groove;

a reverse-conductivity type second semiconductor layer formed in said groove, so formed as to be connected with said first buried layer at the bottom of said groove; and a conductive film formed above said first semiconductor layer and connected with said first diffused layer;

said first buried layer being made to serve as an emitter of the IIL, said first diffused layer as a base of the IIL, said second diffused layer as a collector of the IIL, said third diffused layer as an injector of the IIL, said second semiconductor layer as an emitter lead-out portion of the IIL, and said conductive film as a base electrode of the IIL, said first diffused layer being divided into plural regions by said groove; and said conductive film being so formed as to be connected with said plural regions of said first diffused layer divided by said groove.

* * * * *